(12) United States Patent
Lee

(10) Patent No.: US 9,728,140 B2
(45) Date of Patent: Aug. 8, 2017

(54) ORGANIC LIGHT-EMITTING DIODE DISPLAY

(71) Applicant: Samsung Display Co., Ltd., Yongin, Gyeonggi-Do (KR)

(72) Inventor: Won Kyu Lee, Seoul (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/788,411

(22) Filed: Jun. 30, 2015

(65) Prior Publication Data

US 2016/0203765 A1 Jul. 14, 2016

(30) Foreign Application Priority Data

Jan. 14, 2015 (KR) ........................ 10-2015-0007029

(51) Int. Cl.
*G09G 3/32* (2016.01)
*G09G 3/3291* (2016.01)
(Continued)

(52) U.S. Cl.
CPC ......... *G09G 3/3291* (2013.01); *G09G 3/3225* (2013.01); *H01L 27/3279* (2013.01);
(Continued)

(58) Field of Classification Search
CPC ....... G09G 3/3208–3/3291; G09G 2300/0426; G09G 2320/0204; G06F 3/0412; G06F 3/041; G06F 2001/134318; H01L 27/3276–27/3279; H01L 51/5212; H01L 51/5228; H01L 27/3297; G02F 1/1343;
(Continued)

(56) References Cited

U.S. PATENT DOCUMENTS

| | | | |
|---|---|---|---|
| 6,232,949 B1 * | 5/2001 | Imamura | G09G 3/3622 345/100 |
| 2001/0007413 A1 * | 7/2001 | Battersby | G09G 3/3233 315/169.3 |

(Continued)

FOREIGN PATENT DOCUMENTS

| | | |
|---|---|---|
| JP | 2004-247284 A | 9/2004 |
| JP | 5080248 B2 | 9/2012 |

(Continued)

*Primary Examiner* — Sanjiv D Patel
(74) *Attorney, Agent, or Firm* — Knobbe Martens Olson & Bear LLP

(57) ABSTRACT

An organic light-emitting diode display is disclosed. In one aspect, the organic light-emitting diode display includes a plurality of pixels formed in a display area of a substrate, wherein each of the pixels includes a pixel electrode, an emission layer, and a common electrode. The display also includes an auxiliary common electrode formed in a lattice pattern between at least two of the pixels and electrically connected to the common electrode, wherein the auxiliary common electrode includes two opposing sides. The display further includes a power supply electrically connected to a non-display area of the substrate. The display also includes a pair of first power supply wires formed in the non-display area and configured to electrically connect the power supply to a center portion of the two sides of the auxiliary common electrode.

20 Claims, 12 Drawing Sheets

(51) Int. Cl.
*H01L 27/32* (2006.01)
*H01L 51/52* (2006.01)
*G09G 3/3225* (2016.01)

(52) U.S. Cl.
CPC .... *H01L 51/5228* (2013.01); *G02F 2201/121* (2013.01); *G09G 2300/0426* (2013.01); *G09G 2320/02* (2013.01); *G09G 2320/0223* (2013.01); *G09G 2330/00* (2013.01); *G09G 2330/021* (2013.01); *H01L 27/3246* (2013.01)

(58) Field of Classification Search
CPC ........... G02F 2201/122; G02F 1/13452; G02F 2201/121; G02F 2001/134318
See application file for complete search history.

(56) References Cited

U.S. PATENT DOCUMENTS

| | | | | |
|---|---|---|---|---|
| 2005/0179625 | A1* | 8/2005 | Choi | G09G 3/3233 345/76 |
| 2005/0236970 | A1* | 10/2005 | Matsudate | H01L 27/3244 313/500 |
| 2006/0255726 | A1* | 11/2006 | Kim | H01L 27/3276 313/506 |
| 2008/0197778 | A1* | 8/2008 | Kubota | H01L 27/3258 315/73 |
| 2016/0005358 | A1* | 1/2016 | Wang | G09G 3/3233 345/212 |

FOREIGN PATENT DOCUMENTS

| | | |
|---|---|---|
| KR | 10-2005-0067254 A | 7/2005 |
| KR | 10-2011-0019589 A | 2/2011 |
| WO | WO 2007/063662 A1 | 6/2007 |

* cited by examiner

ORGANIC LIGHT-EMITTING DIODE DISPLAY

INCORPORATION BY REFERENCE TO ANY PRIORITY APPLICATIONS

This application claims priority to and the benefit of Korean Patent Application No. 10-2015-0007029 filed in the Korean Intellectual Property Office on Jan. 14, 2015, the entire contents of which are incorporated herein by reference.

BACKGROUND

Field

The described technology generally relates to an organic light-emitting diode display.

Description of the Related Technology

A plurality of signal lines and a plurality of pixels connected to the signal lines are formed in a display area of an organic light-emitting diode (OLED) display. The signal lines include scan lines for transmitting scan signals, data lines for transmitting data signals, and driving voltage lines for transmitting a driving voltage ELVDD. The scan lines are typically formed in parallel in a row direction, and the data lines and the driving voltage lines are typically formed in parallel in a column direction.

Further, a common voltage ELVSS is transmitted to the pixels through a common electrode, and when the common electrode is formed of a transparent conductive layer, such as an indium tin oxide (ITO), the common electrode has high resistance, so that a voltage is considerably dropped. Accordingly, the voltage drop of the common electrode decreases by forming an auxiliary common electrode, which is in contact with the common electrode, in the display area.

SUMMARY OF CERTAIN INVENTIVE ASPECTS

One inventive aspect relates to an OLED display, which can suppress deterioration in uniformity of image quality due to wire resistance.

Another aspect is an OLED display, including: a plurality of pixels formed in a display area of a substrate, and including a pixel electrode, an emission layer, and a common electrode; an auxiliary common electrode formed in a lattice shape between the plurality of pixels, and being in contact with the common electrode; a power supply unit connected to a non-display area of the substrate; and a pair of first power supply wires formed in the non-display area, and configured to connect the power supply unit and center parts at both sides of the auxiliary common electrode.

The common electrode can be formed of any one of a transparent layer and a semi-transparent layer, and the auxiliary common electrode can be formed of a metal layer. A line width of the auxiliary common electrode can be largest at a center part of the display area, and gradually decrease as distance from the center part of the display area increases.

The OLED display can further include: a driving voltage line formed in a lattice shape between the plurality of pixels; and a pair of second power supply wires formed in the non-display area, and configured to connect the power supply unit and center parts of both sides of the driving voltage line.

The driving voltage line can be covered with a planarizing layer and a pixel defining layer, and the auxiliary common electrode can be formed on the pixel defining layer. A line width of the auxiliary common electrode and a line width of the driving voltage line can be largest at a center part of the display area, and gradually decrease as distance from the center part of the display area increases.

The auxiliary common electrode can include a first connection line of which both ends are connected to the pair of first power supply wires. The OLED display can further include a third power supply wire configured to connect the power supply unit and a center part of the first connection line.

A part of the auxiliary common electrode can be covered with an insulating layer, and a part of the third power supply wire can be formed on the insulating layer. A line width of the auxiliary common electrode can be largest at a center part of the display area, and gradually decrease as distance from the center part of the display area increases.

The driving voltage line can include a second connection line of which both ends are connected to the pair of second power supply wires. The OLED display can further include a fourth power supply wire configured to connect the power supply unit and a center part of the second connection line.

A line width of the auxiliary common electrode and a line width of the driving voltage line can be largest at a center part of the display area, and gradually decrease as distance at a part distant from the center part of the display area increases.

Another aspect is an organic light-emitting diode (OLED) display, comprising: a plurality of pixels formed in a display area of a substrate, wherein each of the pixels includes a pixel electrode, an emission layer, and a common electrode; an auxiliary common electrode formed in a lattice pattern between at least two of the pixels and electrically connected to the common electrode, wherein the auxiliary common electrode includes two opposing sides; a power supply electrically connected to a non-display area of the substrate; and a pair of first power supply wires formed in the non-display area and configured to electrically connect the power supply to a center portion of the two sides of the auxiliary common electrode.

In the above OLED display, the common electrode includes one of a transparent layer and a semi-transparent layer, wherein the auxiliary common electrode is formed of metal.

In the above OLED display, the auxiliary common electrode has a line width that is the greatest at a center portion of the display area, wherein the line width gradually decreases as the auxiliary common electrode becomes farther away from the center portion of the display area.

The above OLED display further comprises: a driving voltage line formed in a lattice pattern between the at least two of the pixels, wherein the driving voltage line includes two opposing sides; and a pair of second power supply wires formed in the non-display area and configured to electrically connect the power supply to a center portion of the two sides of the driving voltage line.

The above OLED display further comprises a pixel defining layer at least partially covering the driving voltage line, wherein the auxiliary common electrode is formed over the pixel defining layer.

In the above OLED display, each of the auxiliary common electrode and the driving voltage line has a line width that is the greatest at a center portion of the display area, wherein the line widths gradually decrease as the auxiliary common electrode and the driving voltage line become from the center portion of the display area.

The above OLED display further comprises a third power supply wire, wherein the auxiliary common electrode includes a first connection line having two opposing ends that are respectively connected to the first power supply wires, and wherein the third power supply wire is configured to electrically connect the power supply to a center portion of the first connection line.

The above OLED display further comprises an insulating layer formed over a portion of the auxiliary common electrode, wherein a portion of the third power supply wire is formed over the insulating layer.

In the above OLED display, the auxiliary common electrode has a line width that is the greatest at a center portion of the display area, wherein the line width gradually decreases as the auxiliary common electrode becomes farther away from the center portion of the display area.

The above OLED display further comprises a fourth power supply wire, wherein the driving voltage line includes a second connection line having two opposing ends respectively connected to the second power supply wires, and wherein the fourth power supply wire is configured to electrically connect the power supply to a center portion of the second connection line.

In the above OLED display, the auxiliary common electrode and the driving voltage line each has line widths that is the greatest at a center portion of the display area, wherein each of the line widths gradually decreases as the auxiliary common electrode and the driving voltage line become farther away from the center portion of the display area.

In the above OLED display, the common electrode is formed on the entire display area, and the auxiliary common electrode contacts with a lower surface of the common electrode.

The above OLED display further comprises a plurality of OLEDs, wherein the auxiliary common electrode overlaps none the OLEDs in the direction of light emission.

Another aspect is an organic light-emitting diode (OLED) display, comprising: a substrate including a display area and a non-display area; a plurality of pixels formed in the display area, wherein each of the pixels includes a common electrode; an auxiliary common electrode formed between the pixels and electrically connected to the common electrode, wherein the auxiliary common electrode includes two opposing ends; a power supply electrically connected to the non-display area; and at least one first power supply wire formed in the non-display area and connecting the power supply to the two ends of the auxiliary common electrode.

In the above OLED display, the auxiliary common electrode has a line width greatest at a center portion of the display area, and wherein the line width gradually decreases the auxiliary common electrode becomes farther away from the center portion of the display area.

The above OLED display further comprises: a driving voltage line formed between the pixels; and at least one second power supply wire formed in the non-display area and configured to electrically connect the power supply to opposing ends of the driving voltage line.

The above OLED display further comprises a pixel defining layer substantially covering the driving voltage line, wherein the auxiliary common electrode is formed over the pixel defining layer.

In the above OLED display, the auxiliary common electrode and the driving voltage line each has a line width that is the greatest at a center portion of the display area, wherein the line widths gradually decrease as auxiliary common electrode and the driving voltage line become farther away from the center portion of the display area.

The above OLED display further comprises a third power supply wire, wherein the auxiliary common electrode includes a first connection line having two opposing ends that are respectively connected to the first power supply wires, and wherein the third power supply wire is configured to electrically connect the power supply to a center portion of the first connection line.

The above OLED display further comprises an insulating layer formed over a portion of the auxiliary common electrode, wherein a portion of the third power supply wire is formed over the insulating layer.

According to at least one of the disclosed embodiments, it is possible to increase luminance at a center part of a display area, to which user's eyes are concentrated, in an OLED display having a large area, and improve uniformity at the center part and a peripheral part of the display area, thereby improving an image quality.

DETAILED DESCRIPTION OF CERTAIN INVENTIVE EMBODIMENTS

Figure 1:
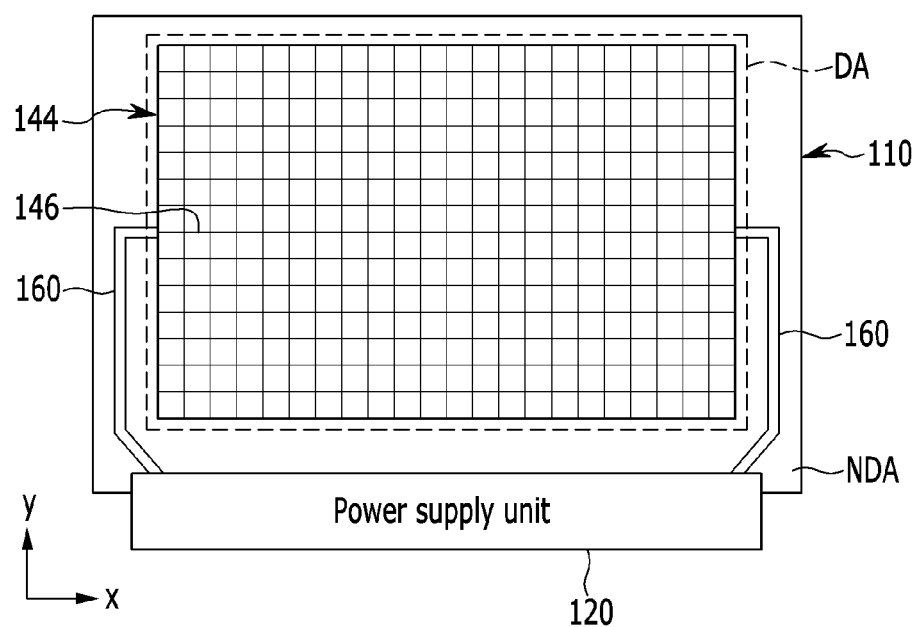
FIG. 1 is a configuration diagram of an OLED display according to a first exemplary embodiment.

When an OLED display is large, wire resistance of the driving voltage line and the auxiliary common electrode increases, so that the magnitude of current flowing in the driving voltage line and the auxiliary common electrode decreases as the distance from the power supply unit increases. Accordingly, the difference between the driving voltage ELVDD and the common voltage ELVSS changes according to the position of the pixel, and the difference affects the driving current Id of the individual pixel OLED, so that there can be a lack of uniformity in image brightness.

The present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

Throughout the specification, it will be understood that when an element such as a layer, film, region, or substrate is referred to as being "on" another element, it can be directly on the other element or intervening elements can also be present. The word "on" means positioning on or below the object portion, but does not essentially mean positioning on the upper side of the object portion based on a gravity direction.

Unless explicitly described to the contrary, the word "comprise" and variations such as "comprises" or "comprising", will be understood to imply the inclusion of stated elements but not the exclusion of any other elements. The size and thickness of each configuration shown in the drawings are arbitrarily shown for understanding and ease of description, but the present disclosure is not limited thereto. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2:
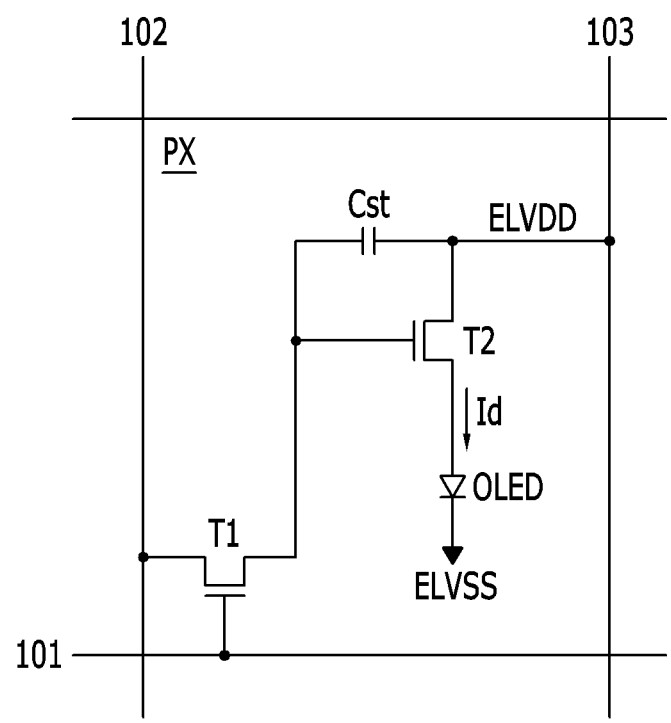
FIG. 2 is an equivalent circuit diagram of one pixel in the OLED display illustrated in FIG. 1.

FIG. 1 is a configuration diagram of an OLED display according to a first exemplary embodiment. FIG. 2 is an equivalent circuit diagram of one pixel in the OLED display illustrated in FIG. 1.

Referring to FIGS. 1 and 2, an OLED display 100 includes a substrate 110 including a display area DA and a power supply unit or power supply 120 for supplying power to the display area DA. The power supply unit 120 can be formed of a flexible printed circuit (FPC) or a printed circuit board (PCB), and is physically and electrically connected to pad electrodes (not illustrated) formed in a non-display area NDA of the substrate 110 via an anisotropic conductive film (not illustrated).

A plurality of signal lines 101, 102, and 103 and a plurality of pixels PX connected with the signal lines 101, 102, and 103 and arranged in an approximate matrix form are formed in the display area DA. The signal lines include a scan line 101 for transmitting a scan signal, a data line 102 for transmitting a data signal, and a driving voltage line 103 for transmitting a driving voltage.

The scan line 101 is typically formed in parallel to a row direction (x-axis direction), and the data line 102 is typically formed in parallel to a column direction (y-axis direction) or a direction crossing the row direction. The driving voltage line 103 can be formed in a lattice shape substantially in parallel in the row and column directions. Each pixel PX includes a switching thin film transistor T1, a driving thin film transistor T2, a storage capacitor Cst, and an OLED.

The switching thin film transistor T1 includes a control terminal, an input terminal, and an output terminal. The control terminal of the switching thin film transistor T1 is connected to the scan line 101, the input terminal thereof is connected to the data line 102, and the output terminal thereof is connected to the driving thin film transistor T2. The switching thin film transistor T1 transmits a data signal applied to the data line 102 to the driving thin film transistor T2 in response to a scan signal applied to the scan line 101.

The driving thin film transistor T2 also includes a control terminal, an input terminal, and an output terminal. The control terminal of the driving thin film transistor T2 is connected to the switching thin film transistor T1, the input terminal thereof is connected to the driving voltage line 103, and the output terminal thereof is connected to the OLED.

The driving thin film transistor T2 allows an output current Id, which varies according to a voltage applied between the control terminal and the output terminal, to flow.

The storage capacitor Cst is connected to the control terminal and the input terminal of the driving thin film transistor T2 between the control terminal and the input terminal of the driving thin film transistor T2. The storage capacitor Cst charges the data signal applied to the control terminal of the driving thin film transistor T2 and maintains the charged data signal even after the switching thin film transistor T1 is turned off.

The OLED includes a pixel electrode connected to the output terminal of the driving thin film transistor T2, a common electrode connected to a common voltage ELVSS, and an emission layer positioned between the pixel electrode and the common electrode. The OLED emits light with intensity varying according to the output current Id of the driving thin film transistor T2.

The configuration of the pixel of the OLED display 100 is not limited to the aforementioned example, and a separate thin film transistor and a separate capacitor can be added.

Figure 3:
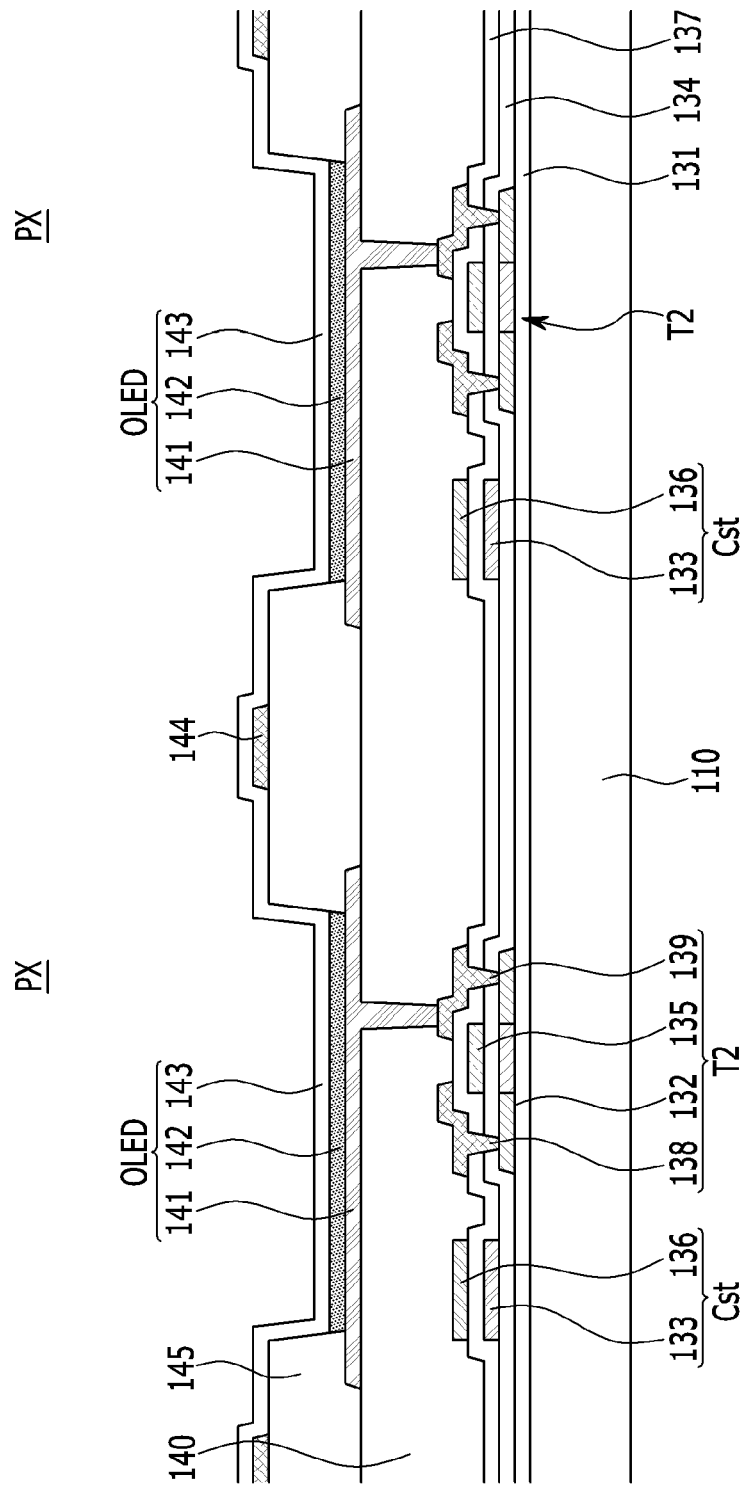
FIG. 3 is an enlarged cross-sectional view of a display area in the OLED display illustrated in FIG. 1.

FIG. 3 is an enlarged cross-sectional view of the display area in the OLED display illustrated in FIG. 1. In FIG. 3, the switching thin film transistor is omitted for convenience.

Referring to FIG. 3, a buffer layer 131 is formed on the substrate 110. The substrate 110 can be an insulating substrate, such as glass, quartz, ceramic, and plastic, or a metal substrate, such as stainless steel. The buffer layer 131 can be formed of a single layer of silicon nitride (SiNx) or a double layer of a silicon nitride (SiNx) and a silicon oxide ($SiO_2$). The buffer layer 131 serves to prevent impurities from permeating through the substrate 110 and planarize a surface.

A semiconductor layer 132 is formed on the buffer layer 131. The semiconductor layer 132 can be formed of polysilicon or an oxide semiconductor, and the semiconductor layer 132 formed of the oxide semiconductor can be at least partially covered with a separate passivation layer. The semiconductor layer 132 includes a channel region with which impurities are not doped, and source and drain regions with which impurities are doped.

A gate insulating layer 134 is formed on the semiconductor layer 132. The gate insulating layer 134 can include a single layer formed of a silicon nitride (SiNx) or a silicon oxide ($SiO_2$) or a stacked layer formed of a silicon nitride (SiNx) and a silicon oxide ($SiO_2$). A gate electrode 135 and a first storage capacitor plate 133 are formed on the gate insulating layer 134. The gate electrode 135 can overlap the channel region of the semiconductor layer 132, and be formed of Au, Cu, Ni, Pt, Pd, Al, Mo, and the like.

An interlayer insulating layer 137 is formed on the gate electrode 135 and the first storage capacitor plate 133. The interlayer insulating layer 137 can include a single layer formed of a silicon nitride (SiNx) or a silicon oxide ($SiO_2$) or a stacked layer formed of a silicon nitride (SiNx) and a silicon oxide ($SiO_2$).

A source electrode 138, a drain electrode 139, and a second storage capacitor plate 136 are formed on the interlayer insulating layer 137. The source electrode 138 and the drain electrode 139 are respectively connected to the source region and the drain region of the semiconductor layer 132 through via holes formed in the interlayer insulating layer 137 and the gate insulating layer 134, respectively. The source electrode 138 and the drain electrode 139 can be formed of a metal multilayer, such as Mo/Al/Mo or Ti/Al/Ti.

The second storage capacitor plate 136 overlaps the first storage capacitor plate 133. Accordingly, the first and second storage capacitor plates 133 and 136 can configure the storage capacitor Cst which uses the interlayer insulating layer 137 as a dielectric substance.

In FIG. 3, the present disclosure has been described based on the driving thin film transistor T2 in a top gate type as an example, but the structure of the driving thin film transistor T2 is not limited to the illustrated example. The driving thin film transistor T2 is covered and protected by a planarizing layer 140, and is electrically connected to the OLED to drive the OLED.

The planarizing layer 140 can include a single layer formed of an inorganic insulating material or an organic insulating material, or a stacked layer formed of an inorganic insulating material and an organic insulating material. The inorganic insulating material can include $SiO_2$, SiNx, $Al_2O_3$, $TiO_2$, $ZrO_2$, and the like, and the organic insulating material can include an acryl-based polymer, an imide-based polymer, polystyrene (PS), and the like.

A pixel electrode 141 is formed on the planarizing layer 140. Each pixel electrode 141 is formed in each pixel PX, and is connected to the drain electrode 139 of the driving thin film transistor T2 through a via hole formed in the planarizing layer 140. A pixel defining layer 145 (or a partition wall) is formed on the planarizing layer 140 and at an edge of the pixel electrode 141. The pixel defining layer 145 can be formed of a polyacrylic or polyimide-based resin, a silica-based inorganic material, and the like.

An emission layer 142 is formed on the pixel electrode 141, and a common electrode 143 is formed on the emission layer 142 and the pixel defining layer 145. The common electrode 143 is formed on the entire display area DA. One of the pixel electrode 141 and the common electrode 143 serves as an anode for injecting holes to the emission layer 142, and the other serves as the cathode for injecting electrons to the emission layer 142.

The emission layer 142 includes an organic emission layer, and includes at least one of a hole injecting layer, a hole transporting layer, an electron transporting layer, and an electron injecting layer. When the pixel electrode 141 is the anode and the common electrode 143 is the cathode, the hole injecting layer, the hole transporting layer, the organic emission layer, the electron transporting layer, and the electron injecting layer can be sequentially stacked on the pixel electrode 141.

When the OLED display 100 is a top emission type, the pixel electrode 141 can be formed of a reflective layer, and the common electrode 143 can be formed of a transparent layer or a semi-transparent layer. Accordingly, light emitted from the emission layer 142 can be reflected from the pixel electrode 141, and can pass through the common electrode 143 to be discharged to the outside.

The reflective layer can be formed of Au, Ag, Mg, Al, Pt, Pd, Ni, Nd, Ir, Cr, and the like. The transparent layer can be formed of an indium tin oxide (ITO), an indium zinc oxide (IZO), a ZnO, $In_2O_3$, and the like. The semi-transparent layer can include a metal thin film formed of Li, Ca, LiF/Ca, LiF/Al, Al, Ag, Mg, and the like, and a transparent layer, such as ITO, IZO, ZnO, and $In_2O_3$, can be formed on the semi-transparent layer.

The common electrode 143 including the transparent layer or the semi-transparent layer in the top emission type has relatively high resistance, so that a voltage drop can be generated. The voltage drop can cause deterioration in luminance of a screen. Accordingly, in some embodiments, an auxiliary common electrode 144 for suppressing a voltage drop of the common electrode 143 is formed on one surface of the common electrode 143, for example, a lower surface of the common electrode 143.

The auxiliary common electrode 144 can be formed on the pixel defining layer 145 and can be in contact with the common electrode 143. The auxiliary common electrode 144 can be formed between the pixels PX, for example, the emission layers 142, so as not to block light of the emission layer 142. The auxiliary common electrode 144 can include a metal layer having low resistance, and can be formed in a lattice shape substantially parallel in the row and column directions.

Referring back to FIG. 1, the auxiliary common electrode 144 is formed in the lattice shape in the entire display area DA, and a pair of first power supply wires 160 for connecting the power supply unit 120 and the auxiliary common electrode 144 is formed in the non-display area NDA of the substrate 110. The pair of first power supply wires 160 connects the power supply unit 120 and center portions at both sides of the auxiliary common electrode 144 and applies the common voltage ELVSS to the auxiliary common electrode 144.

The auxiliary common electrode 144 includes a first connection line 146 that has both ends connected to the pair of first power supply wires 160. The first connection line 146 passes through the center of the display area DA in the row direction (x-axis direction). Since center portions of the auxiliary common electrode 144 receive the common voltage ELVSS before the portions away from the center portions, wire resistance of the auxiliary common electrode 144 increases, based on FIG. 1, in a direction from the first connection line 146 to an upper side and a direction from the first connection line 146 to a lower side of the display area DA.

When the wire resistance increases, the amount of current flowing in the auxiliary common electrode 144 decreases, so that luminance is highest at the center portion of the display area DA and luminance slightly decreases at upper and lower ends of the display area DA. However, an user's eyes are usually mainly focused at a center of the display area DA in the OLED display 100 having a large screen, such that it is difficult for a user to recognize minimal weak luminance degradation at the upper end and the lower end of the display area DA.

Figure 4:
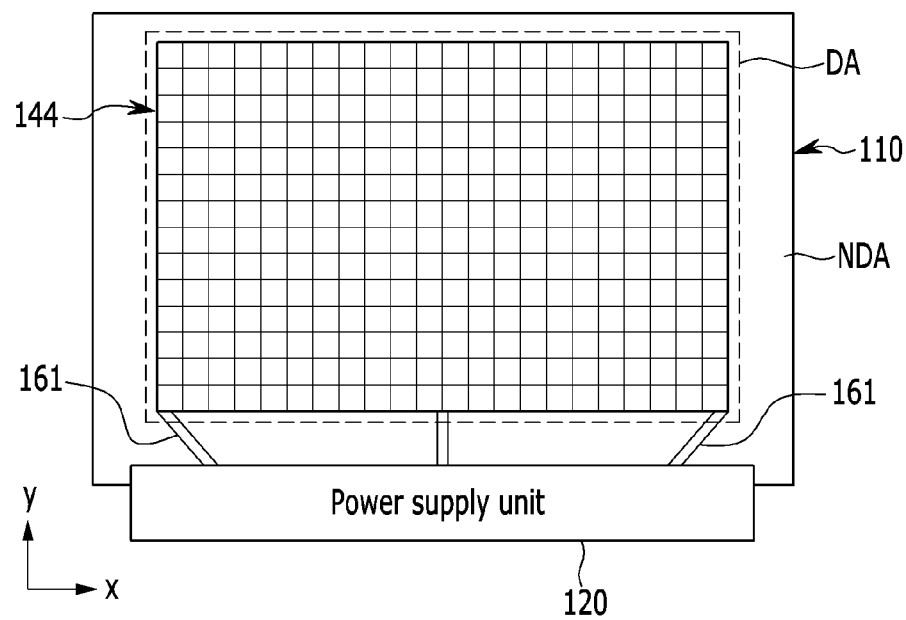
FIG. 4 is a schematic diagram illustrating an OLED display of a Comparative Example.

Further, a degree of an increase in wire resistance and a degree of a decrease in luminance at the upper and lower ends of the auxiliary common electrode 144 are only about half of each of those of an OLED display of a Comparative Example. FIG. 4 is a schematic diagram illustrating the OLED display of the Comparative Example.

Referring to FIG. 4, in an OLED display 200 of the Comparative Example, an auxiliary common electrode 144 is formed in a lattice shape in an entire display area DA, and power supply wires 161 connect a lower end of the auxiliary common electrode 144 to a power supply unit 120. In this case, wire resistance is increased from the lower end to an upper end of the auxiliary common electrode 144, so that luminance of the display area DA gradually decreases as distance away from the power supply unit 120 increases.

Comparing FIG. 1 and FIG. 4, the length of the auxiliary common electrode 144, in which wire resistance is generated, in the first exemplary embodiment corresponds to about half of that of the Comparative Example. Accordingly, a degree of a decrease in luminance at the upper and lower ends of the auxiliary common electrode 144 due to wire resistance in the first exemplary embodiment is also about half of that of the Comparative Example.

Accordingly, the OLED display 100 of the first exemplary embodiment can increase luminance at the center part of the display area DA compared to the Comparative Example, and minimize deterioration in luminance at the upper and lower ends of the display area DA, thereby improving screen quality. In the meantime, the driving voltage line 103 in the OLED display 100 of the first exemplary embodiment can have substantially the same characteristics as that of the aforementioned auxiliary common electrode 144.

Figure 5:
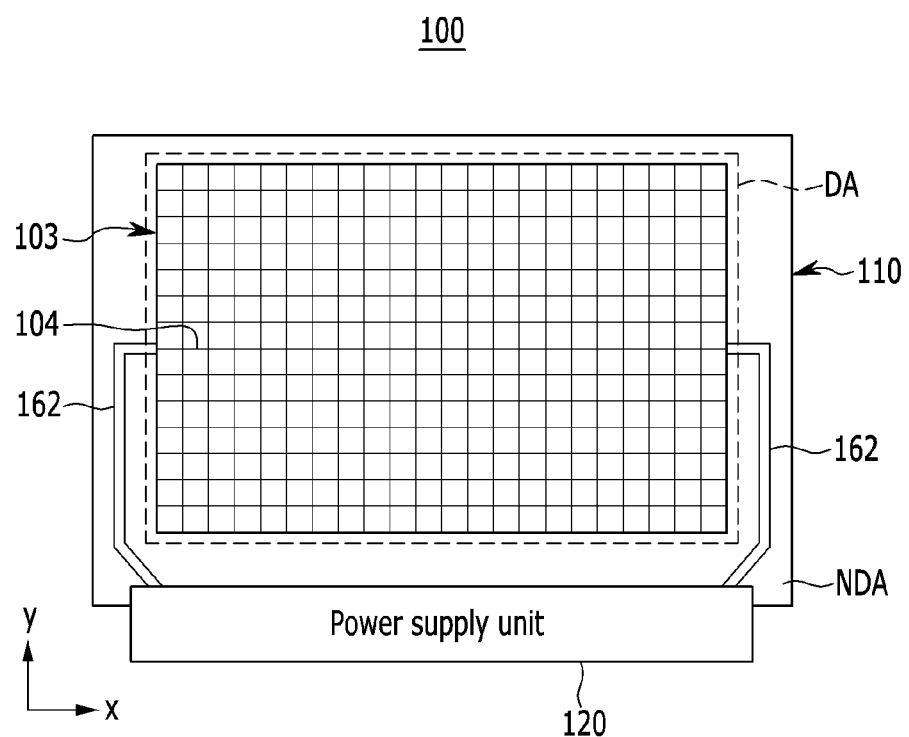
FIG. 5 is a schematic diagram illustrating a driving voltage line in the OLED display according to the first exemplary embodiment.

FIG. 5 is a schematic diagram illustrating a driving voltage line in the OLED display according to the first exemplary embodiment.

Referring to FIG. 5, the driving voltage line 103 is formed in a lattice shape substantially in parallel to the row direction (x-axis direction) and the column direction (y-axis direction) in the display area DA. A pair of second power supply wires 162 for connecting the power supply unit 120 and the driving voltage line 103 is formed in the non-display area NDA of the substrate 110. The pair of second power supply lines 162 connects the power supply unit 120 to the driving voltage line 103 to apply the driving voltage ELVDD to the driving voltage line 103.

The driving voltage line 103 can be formed on the same layer as that of the source and drain electrodes 138 and 139 under the planarizing layer 140. In the non-display area NDA, the second power supply wire 162 can be formed on the same layer as that of the first power supply wire 160 with a predetermined distance, an insulating layer (not illustrated) can be formed on the second power supply line 162, and the first power supply wire 160 can be formed on the insulating layer.

Both ends of the driving voltage line 103 includes a second connection line 104 that has both ends connected to the pair of second power supply wires 162. The second connection line 104 passes through a center of the display area DA in the row direction. Since the center portions of the driving voltage line 103 receive the driving voltage ELVDD before the portions away from the center portions, wire resistance of the driving voltage line 103 increases, based on FIG. 5, in a direction from the second connection line 104 to an upper side and a direction from the second connection line 104 to a lower side from the second connection line 104 of the display area DA.

Similar to the case of the aforementioned auxiliary common electrode 144, the OLED display 100 of the first exemplary embodiment including the aforementioned driving voltage line 103 and second power supply wires 162 can increase luminance at a center portion of the display area DA and minimize deterioration in luminance at the upper end and the lower end of the display area DA, thereby improving screen quality.

Figure 6:
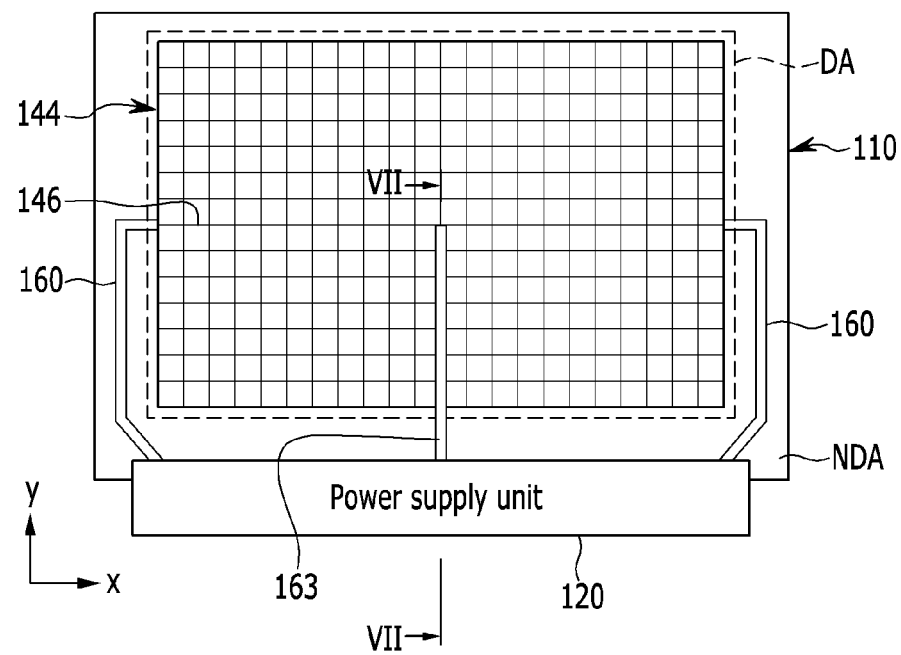
FIG. 6 is a configuration diagram illustrating an OLED display according to a second exemplary embodiment.
Figure 7:
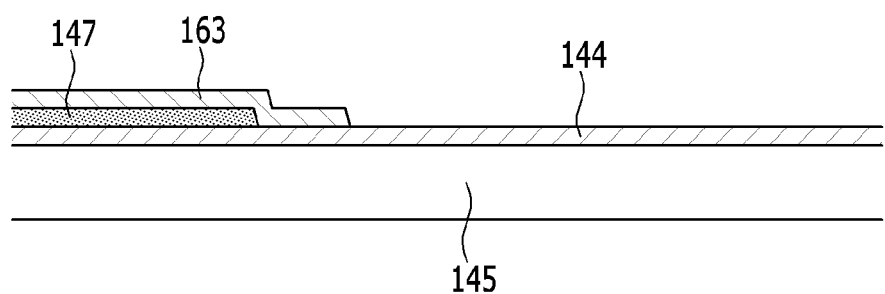
FIG. 7 is a partial cross-sectional view taken along line VII-VII of FIG. 6.

FIG. 6 is a configuration diagram illustrating an OLED display according to a second exemplary embodiment. FIG. 7 is a partial cross-sectional view taken along line VIII-VII of FIG. 6.

Referring to FIGS. 6 and 7, an OLED display 100A according to the second exemplary embodiment has the same configuration as that of the aforementioned first exemplary embodiment, except that the OLED display 100A further includes for a third power supply wire 163 for connecting a power supply unit 120 and a center portion of a first connection line 146. The same member as that of the first exemplary embodiment is denoted by the same reference numeral, and different parts from those of the first exemplary embodiment will be mainly described below.

In an auxiliary common electrode 144, both ends and a center portion of the first connection line 146 receive earliest a common voltage ELVSS by a pair of first power supply wires 160 and the third power supply wire 163. It is possible to suppress an increase in resistance of the auxiliary common electrode 144 in a row direction (x-axis direction) by the third power supply wire 163. Accordingly, the OLED display 100A according to the second exemplary embodiment increases luminance at a center portion of a display area DA and improve left and right uniformity of the luminance of the display area DA by using the third power supply wire 163.

Contrary to the pair of first power supply wires 160 formed in a non-display area NDA of a substrate 110, a portion of the third power supply wire 163 passes through about a half of the display area DA to be in contact with the center portion of the first connection line 146. To this end, an insulating layer 147 can be formed on the auxiliary common electrode 144 substantially in parallel to the column direction (y-axis direction) in a lower region of the first connection line 146 in the auxiliary common electrode 144, and the third power supply wire 163 can be formed on the insulating layer 147 to be in contact with the center portion of the first connection line 146.

The manner in which the third power supply wire 163 is in contact with the center portion of the first connection line 146 is not limited to the example illustrated in FIG. 7, and can be variously modified. In the meantime, a driving voltage line in the OLED display 100A of the second exemplary embodiment can have the same characteristic as that of the aforementioned auxiliary common electrode 144.

Figure 8:
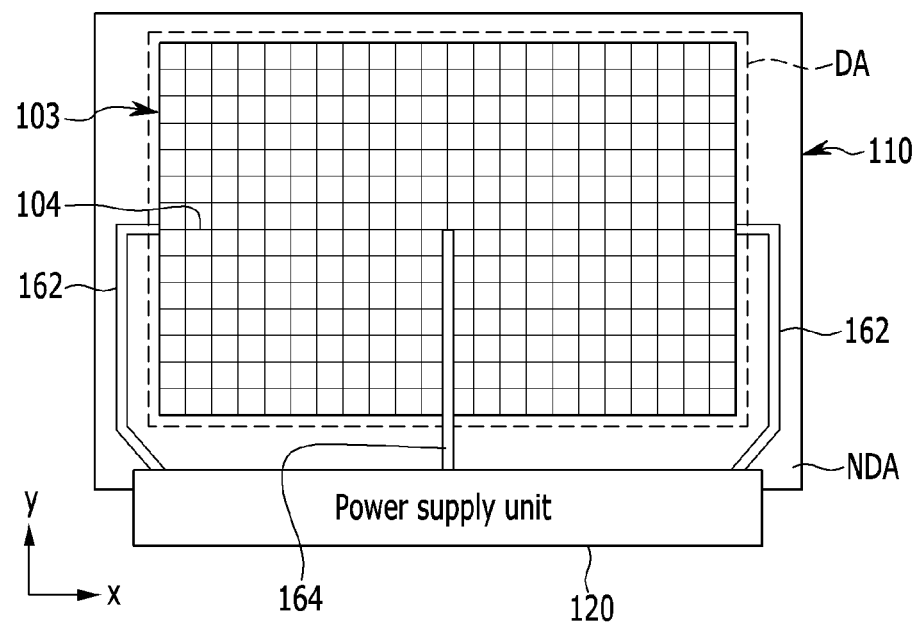
FIG. 8 is a schematic diagram illustrating a driving voltage line in the OLED display according to the second exemplary embodiment.

FIG. 8 is a schematic diagram illustrating a driving voltage line in the OLED display according to the second exemplary embodiment.

Referring to FIG. 8, the driving voltage line 103 includes a second connection line 104 that has both ends connected to a pair of second power supply wires 162. A fourth power supply wire 164 connects the power supply unit 120 and a center portion of the second connection line 104. In the driving voltage line 103, both ends and the center portion of the second connection line 104 receive earliest a driving voltage ELVDD by the pair of second power supply wires 162 and the fourth power supply wire 164.

It is possible to suppress an increase in resistance of the driving voltage line 103 in a row direction (x-axis direction) by the fourth power supply wire 164. Similar to the case of the aforementioned auxiliary common electrode 144, the OLED display 100A of the second exemplary embodiment including the aforementioned driving voltage line 103, second power supply wires 162, and fourth power supply wire 164 can increase luminance at the center portion of the display area DA and improve left and right uniformity of luminance of the display area DA.

A portion of the fourth power supply wire 164 traverses about a half of the display area DA to be in contact with the center portion of the second connection line 104. To this end, an insulating layer (not illustrated) can be formed on the driving voltage line 103 substantially in parallel to a column direction (y-axis direction) in a lower region of the second connection line 104 in the driving voltage line 103. The fourth power supply wire 164 can be formed on the insulating layer to be in contact with the center portion of the second connection line 104. The manner in which the fourth power supply wire 164 is in contact with the center portion of the second connection line 104 is not limited to the aforementioned example.

Figure 9:
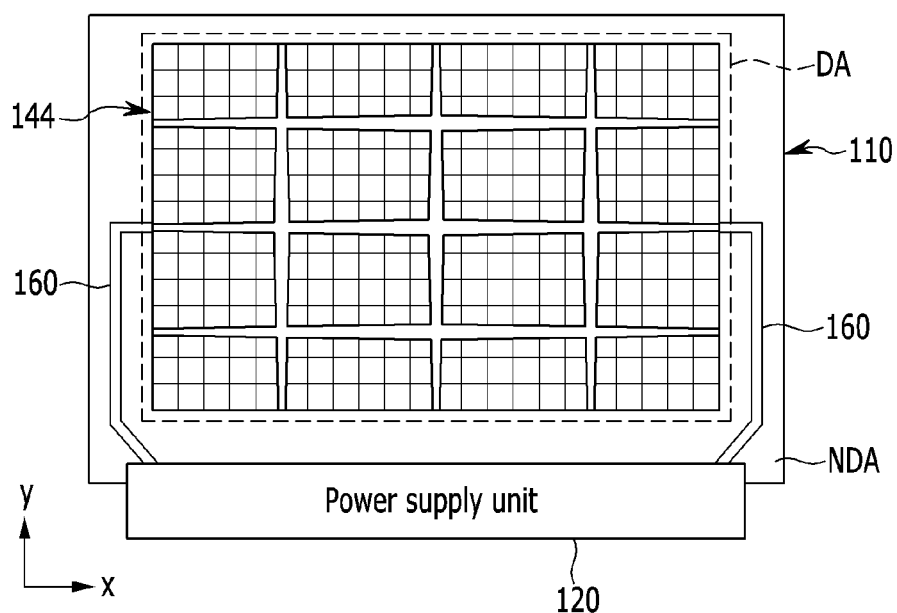
FIG. 9 is a configuration diagram illustrating an OLED display according to a third exemplary embodiment.

FIG. 9 is a configuration diagram illustrating an OLED display according to a third exemplary embodiment.

Referring to FIG. 9, an OLED display 100B according to the third exemplary embodiment has the same configuration as that of the aforementioned first exemplary embodiment, except that a line width of an auxiliary common electrode 144 is the greatest at a center portion of a display area DA and decreases as distance away from the center portion of the display area DA increases. The same member as that of the first exemplary embodiment is denoted by the same reference numeral, and different configurations from those of the first exemplary embodiment will be mainly described below.

The line width of the auxiliary common electrode 144 decreases in a row direction (x-axis direction) and a column direction (y-axis direction) as distance from the center portion of the display area DA increases. Accordingly, the line width of the auxiliary common electrode 144 is the greatest at the center portion of the display area DA, and is the least at four corner portions of the display area DA. In FIG. 9, three lines substantially in parallel to the row direction and three lines substantially in parallel to the column direction in the auxiliary common electrode 144 are exaggeratedly illustrated.

When the line width of the auxiliary common electrode 144 is great, it is possible to decrease wire resistance, so that the OLED display 100B according to the third exemplary embodiment can effectively improve luminance at the center portion of the display area DA on which the user's eyes are mainly concentrated. In the meantime, a driving voltage line in the OLED display 100B of the third exemplary embodiment can have the same characteristic as that of the aforementioned auxiliary common electrode 144.

Figure 10:
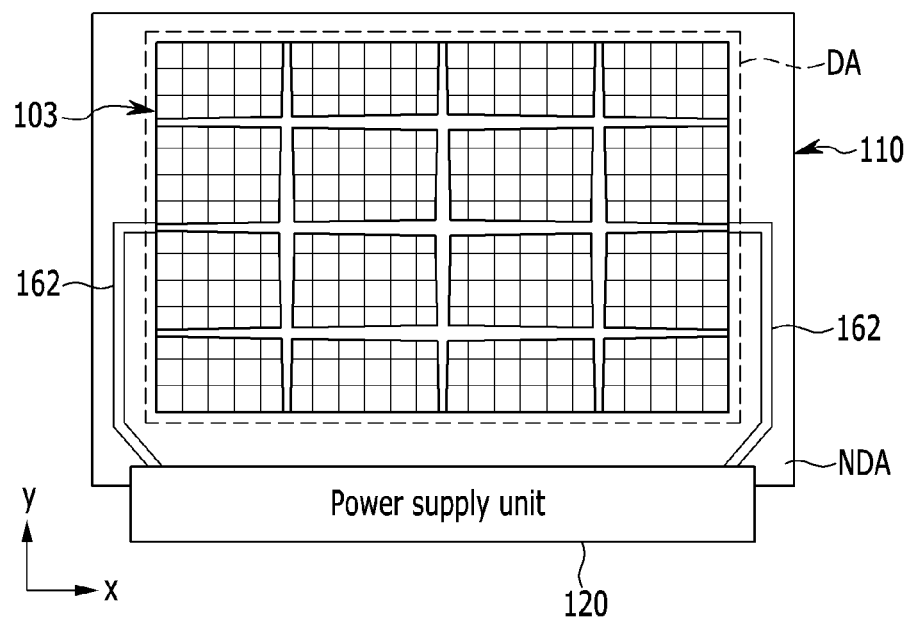
FIG. 10 is a schematic diagram illustrating a driving voltage line in the OLED display according to the third exemplary embodiment.

FIG. 10 is a schematic diagram illustrating a driving voltage line in the OLED display according to the third exemplary embodiment.

Referring to FIG. 10, a line width of a driving voltage line 103 is largest at the center portion of the display area DA, and decreases as distance away from the center portion of the display area DA in the row direction (x-axis direction) and the column direction (y-axis direction) increases. In FIG. 10, three lines substantially in parallel to the row direction and three lines substantially in parallel to the column direction in the driving voltage line 103 are exaggeratedly illustrated.

Similar to the case of the aforementioned auxiliary common electrode 144, the OLED display 100B according to the third exemplary embodiment including the driving voltage line 103 can effectively improve luminance at the center portion of the display area DA on which the user's eyes are mainly concentrated.

Figure 11:
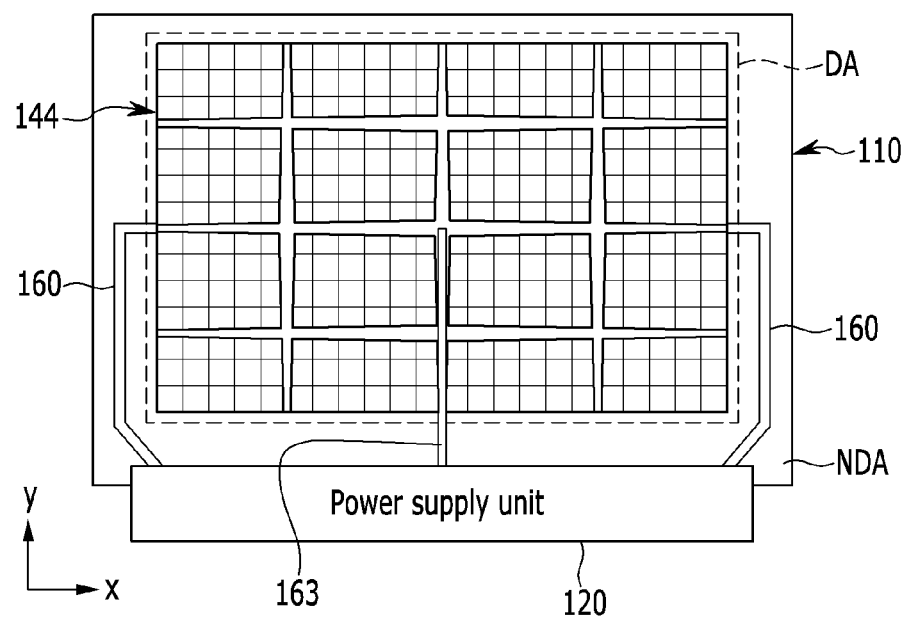
FIG. 11 is a configuration diagram illustrating an OLED display according to a fourth exemplary embodiment.

FIG. 11 is a configuration diagram illustrating an OLED display according to a fourth exemplary embodiment.

Referring to FIG. 11, an OLED display 100C according to the fourth exemplary embodiment has the same configuration as that of the aforementioned second exemplary embodiment, except that a line width of an auxiliary common electrode 144 is the greatest at a center portion of a display area DA and decreases as distance away from the center portion of the display area DA increases.

When the line width of the auxiliary common electrode 144 is great, it is possible to decrease wire resistance, so that the OLED display 100C according to the fourth exemplary embodiment can effectively improve luminance at the center portion of the display area DA on which the user's eyes are mainly concentrated. In the meantime, a driving voltage line in the OLED display 100C of the fourth exemplary embodiment can have the same characteristics as that of the aforementioned auxiliary common electrode 144.

Figure 12:
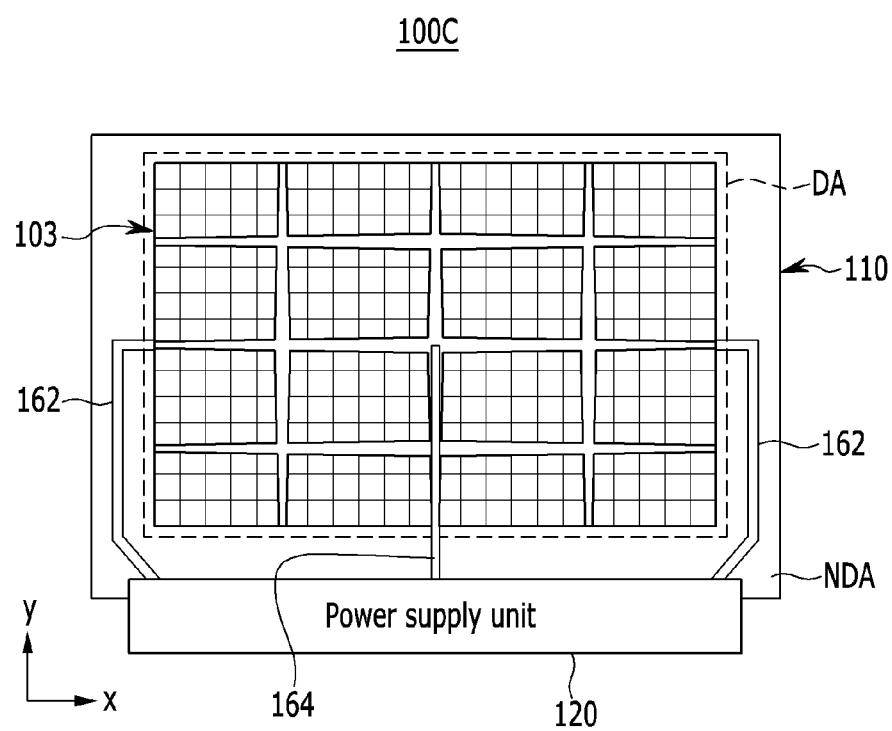
FIG. 12 is a schematic diagram illustrating a driving voltage line in the OLED display according to the fourth exemplary embodiment.

FIG. 12 is a schematic diagram illustrating a driving voltage line in the OLED display according to the fourth exemplary embodiment.

Referring to FIG. 12, a line width of a driving voltage line 103 is the greatest at the center portion of the display area DA, and decreases as distance away from the center portion of the display area DA in the row direction (x-axis direction) and the column direction (y-axis direction) increases. Similar to the case of the aforementioned auxiliary common electrode 144, the OLED display 100C according to the fourth exemplary embodiment including the driving voltage line 103 can effectively improve luminance at the center portion of the display area DA on which the user's eyes are mainly concentrated.

While this disclosure has been described in connection with what is presently considered to be practical exemplary embodiments, it is to be understood that the inventive technology is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a plurality of pixels formed in a display area of a substrate, wherein each of the pixels includes a pixel electrode, an emission layer, and a common electrode;
   an auxiliary common electrode formed in a lattice pattern between at least two of the pixels and electrically connected to the common electrode, wherein the auxiliary common electrode includes two opposing sides;
   a power supply electrically connected to a non-display area of the substrate; and
   a pair of first power supply wires formed in the non-display area and directly connected to center portions of the two opposing sides of the auxiliary common electrode and the power supply, wherein the auxiliary common electrode includes a top side and a bottom side that is closer to the power supply than the top side, and wherein the first power supply wires do not contact the bottom side, and
   wherein the top side and the bottom side are different from the two opposing sides.

2. The OLED display of claim 1, wherein the common electrode includes one of a transparent layer and a semi-transparent layer, and wherein the auxiliary common electrode is formed of metal.

3. The OLED display of claim 1, wherein the auxiliary common electrode has a line width that is the greatest at a center portion of the display area, and wherein the line width gradually decreases as the auxiliary common electrode becomes farther away from the center portion of the display area.

4. The OLED display of claim 1, further comprising:
   a driving voltage line formed in a lattice pattern between the at least two of the pixels, wherein the driving voltage line includes two opposing sides; and
   a pair of second power supply wires formed in the non-display area and configured to electrically connect the power supply to a center portion of the two sides of the driving voltage line.

5. The OLED display of claim 4, further comprising a pixel defining layer at least partially covering the driving voltage line, wherein the auxiliary common electrode is formed over the pixel defining layer.

6. The OLED display of claim 4, wherein each of the auxiliary common electrode and the driving voltage line has a line width that is the greatest at a center portion of the display area, and wherein the line widths gradually decrease as the auxiliary common electrode and the driving voltage line become from the center portion of the display area.

7. The OLED display of claim 1, further comprising a third power supply wire, wherein the auxiliary common electrode includes a first connection line having two opposing ends that are respectively connected to the first power supply wires, and wherein the third power supply wire is configured to electrically connect the power supply to a center portion of the first connection line.

8. The OLED display of claim 7, further comprising an insulating layer formed over a portion of the auxiliary common electrode, wherein a portion of the third power supply wire, is formed over the insulating layer.

9. The OLED display of claim 7, wherein the auxiliary common electrode has a line width that is the greatest at a center portion of the display area, and wherein the line width gradually decreases as the auxiliary common electrode becomes farther away from the center portion of the display area.

10. The OLED display of claim 7, further comprising a fourth power supply wire, wherein the driving voltage line includes a second connection line having two opposing ends respectively connected to the second power supply wires, and wherein the fourth power supply wire is configured to electrically connect the power supply to a center portion of the second connection line.

11. The OLED display of claim 10, wherein the auxiliary common electrode and the driving voltage line each has line widths that is the greatest at a center portion of the display area, and wherein each of the line widths gradually decreases as the auxiliary common electrode and the driving voltage line become farther away from the center portion of the display area.

12. The OLED display of claim 1, wherein the common electrode is formed on the entire display area, and wherein the auxiliary common electrode contacts with a lower surface of the common electrode.

13. The OLED display of claim 1, further comprising a plurality of OLEDs, wherein the auxiliary common electrode overlaps none the OLEDs in the direction of light emission.

14. An organic light-emitting diode (OLED) display, comprising:
 a substrate including a display area and a non-display area;
 a plurality of pixels formed in the display area, wherein each of the pixels includes a common electrode;
 an auxiliary common electrode formed between the pixels and electrically connected to the common electrode, wherein the auxiliary common electrode includes two opposing ends;
 a power supply electrically connected to the non-display area; and
 at least one first power supply wire formed in the non-display area and directly connected to the two opposing ends of the auxiliary common electrode and the power supply, wherein the auxiliary common electrode includes a top end and a bottom end that is closer to the power supply than the top end, and wherein the first power supply wire does not contact the bottom end, and wherein the top end and the bottom end are different from the two opposing ends.

15. The OLED display of claim 14, wherein the auxiliary common electrode has a line width greatest at a center portion of the display area, and wherein the line width gradually decreases the auxiliary common electrode becomes farther away from the center portion of the display area.

16. The OLED display of claim 14, further comprising:
 a driving voltage line formed between the pixels; and
 at least one second power supply wire formed in the non-display area and configured to electrically connect the power supply to opposing ends of the driving voltage line.

17. The OLED display of claim 16, further comprising a pixel defining layer substantially covering the driving voltage line, wherein the auxiliary common electrode is formed over the pixel defining layer.

18. The OLED display of claim 16, wherein the auxiliary common electrode and the driving voltage line each has a line width that is the greatest at a center portion of the display area, and wherein the line widths gradually decrease as auxiliary common electrode and the driving voltage line become farther away from the center portion of the display area.

19. The OLED display of claim 14, further comprising a third power supply wire, wherein the auxiliary common electrode includes a first connection line having two opposing ends that are respectively connected to the first power supply wires, and wherein the third power supply wire is configured to electrically connect the power supply to a center portion of the first connection line.

20. The OLED display of claim 19, further comprising an insulating layer formed over a portion of the auxiliary common electrode, wherein a portion of the third power supply wire is formed over the insulating layer.

* * * * *